(12) United States Patent
Winch et al.

(10) Patent No.: US 9,930,816 B2
(45) Date of Patent: Mar. 27, 2018

(54) MODULAR ELECTROMAGNETICALLY SHIELDED ENCLOSURE

(71) Applicants: Gary William Winch, Naples, NY (US); Brian Donald Smith, Keuka Park, NY (US)

(72) Inventors: Gary William Winch, Naples, NY (US); Brian Donald Smith, Keuka Park, NY (US)

(73) Assignee: Select Fabricators, Inc., Canandaigua, NY (US)

( * ) Notice: Subject to any disclaimer, the term of this patent is extended or adjusted under 35 U.S.C. 154(b) by 0 days.

(21) Appl. No.: 15/218,326

(22) Filed: Jul. 25, 2016

(65) Prior Publication Data

US 2018/0027706 A1    Jan. 25, 2018

(51) Int. Cl.
| | |
|---|---|
| *H05K 9/00* | (2006.01) |
| *E04B 1/92* | (2006.01) |
| *E04F 15/00* | (2006.01) |
| *E04F 13/07* | (2006.01) |

(52) U.S. Cl.
CPC ............ *H05K 9/0003* (2013.01); *E04B 1/92* (2013.01); *E04F 13/07* (2013.01); *E04F 15/00* (2013.01); *H05K 9/0005* (2013.01); *H05K 9/0015* (2013.01); *E04B 2001/925* (2013.01)

(58) Field of Classification Search
CPC ....... H05K 9/0007; H01R 13/72; H01R 27/02
USPC ......................................................... 174/382
See application file for complete search history.

(56) References Cited

U.S. PATENT DOCUMENTS

| | | | |
|---|---|---|---|
| 3,390,491 A | | 7/1968 | Hayden et al. |
| 3,432,609 A | | 3/1969 | Duvall et al. |
| 4,959,504 A | * | 9/1990 | Yarger ................ H05K 9/0001 174/386 |
| 5,043,529 A | * | 8/1991 | Vanesky ............ A61B 5/04005 174/363 |
| 5,510,575 A | * | 4/1996 | Weibler .................. E06B 3/24 174/381 |
| 5,706,624 A | * | 1/1998 | Lipson .................. E04B 1/3211 403/403 |
| 5,908,043 A | | 6/1999 | Paes et al. |
| 6,011,504 A | | 1/2000 | Tan |

(Continued)

FOREIGN PATENT DOCUMENTS

| | | |
|---|---|---|
| FR | 2844961 A1 | 3/2004 |
| WO | WO 9315293 A1 | 8/1993 |

*Primary Examiner* — Timothy Thompson
*Assistant Examiner* — Charles Pizzuto
(74) *Attorney, Agent, or Firm* — Patent Technologies, LLC; Robert D. Gunderman, Jr.

(57) ABSTRACT

A modular electromagnetically shielded enclosure is provided. The enclosure includes connective frame elements that make up a support frame assembly. Conductive fabric panels are fastened to the connective frame elements to form walls and ceiling. A modular electromagnetically shielded floor assembly is made up of floor panels with rabbet edges that form channels for the placement of electromagnetic shielding gaskets and floor panel connectors. The conductive fabric panels that make up the walls of the enclosure are fastened to the modular electromagnetically shielded floor assembly to form a faraday cage environment that can be readily assembled to create a large or very large shielded enclosure and that can be reconfigured with continued radiofrequency shielding effectiveness.

14 Claims, 9 Drawing Sheets

(56) References Cited

U.S. PATENT DOCUMENTS

| | | | |
|---|---|---|---|
| 6,068,009 | A | 5/2000 | Paes et al. |
| 6,140,576 | A | 10/2000 | Kanne et al. |
| 7,117,640 | B2 | 10/2006 | Hurzeler |
| 7,246,681 | B2 | 7/2007 | Christen |
| 7,335,838 | B2 | 2/2008 | Simola |
| 8,530,756 | B1 | 9/2013 | Winch |
| 8,723,053 | B2 | 5/2014 | Winch et al. |
| 9,029,714 | B2 | 5/2015 | Winch et al. |

* cited by examiner

MODULAR ELECTROMAGNETICALLY SHIELDED ENCLOSURE

BACKGROUND OF THE INVENTION

1. Field of the Invention

This invention relates generally to electromagnetic shielding, and more specifically to a modular electromagnetically shielded enclosure that can also be scaled to create large and very large enclosures.

2. Description of Related Art

As radiofrequency generating devices continue to proliferate and become more widespread and diverse, there is an ongoing and growing need to shield from unwanted electromagnetic radiation for a variety of purposes. For example, certain electronic equipment requires an electromagnetically "quiet" environment to function properly. Such equipment includes, for example, some medical diagnostic and imaging equipment, a variety of aeronautics and military electronics, satellite communications equipment, and the like. In addition, testing of electronic equipment often requires an electromagnetically "quiet" environment.

In some situations, there is also the need to prevent electromagnetic radiation of radiofrequency generating equipment from leaving a confined physical area. Such situations include, for example, the use of computer and military electronics where there is the risk of unwanted detection of a radiated radiofrequency signal or unwanted detection of the associated harmonics and signature of radiofrequency activity.

Further, testing such as EMI/EMC testing requires the monitoring of electromagnetic energy released from a device under test in a controlled environment where there are little or no outside sources of electromagnetic radiation that could interfere with the monitoring of the device under test. Such testing may also include subjecting a device under test to external electromagnetic energy and monitoring the impact of this external electromagnetic energy on the proper functioning of the device under test.

With the various requirements for electromagnetically shielded enclosures, there exists a need to make these enclosures portable, lightweight, rapidly deployable, temporary, and relatively low cost. With the advent of metalized fabrics and textiles, shielded tents and portable enclosures are possible. These enclosures are essentially a Faraday Cage where electromagnetic signals should not pass. Such enclosures come in many shapes and sizes, and are available from various manufacturers. While such enclosures are available, their shielding effectiveness may not always be adequate due to radiofrequency leakage at seams and ingress/egress points such as doors, cable pass throughs, and the like. As such, the overall construction of a portable electromagnetically shielded enclosure is a vital part of the performance of the shielded enclosure. Various enclosures have been developed to ensure electromagnetic shielding effectiveness by way of their novel construction. An Electromagnetically Shielded Enclosure And Entry Seal is disclosed by Gary William Winch in U.S. Pat. No. 8,530,756. Further, an Electromagnetically Shielded Enclosure And Double Perimeter Entry Seal is disclosed by Gary William Winch and Brian Donald Smith in U.S. Pat. No. 9,029,714. On a smaller scale, an Electromagnetically Shielded Enclosure With Operable Interfaces is disclosed by Gary William Winch and Brian Donald Smith in U.S. Pat. No. 8,723,053. The disclosure of each of these patents is incorporated herein by reference in their entirety. While often times such enclosures are fully suitable for most shielding applications, situations exist where a large or very large scale electromagnetically shielded enclosure is needed in order to accommodate certain equipment. Furthermore, at times a need exists for electromagnetically shielded enclosures that are modular and have components that can be restructured, repurposed or otherwise reconfigured to meet changing requirements for the enclosure. Additionally, an electromagnetically shielded enclosure having an internal frame to allow one to hang, connect, or otherwise fasten accessories such as anechoic foam from within the enclosure is needed. Thus, what is needed is a modular electromagnetically shielded enclosure that can be readily assembled to create a large or very large enclosure or that can be reconfigured while maintaining radiofrequency shielding effectiveness.

BRIEF SUMMARY OF THE INVENTION

In accordance with the present invention, there is provided a modular electromagnetically shielded enclosure having sides, a ceiling and a floor, the modular electromagnetically shielded enclosure comprising a support frame assembly comprising a plurality of connective frame elements; wherein each connective frame element comprises a first electromagnetic shielding gasket; at least one conductive panel conductively and mechanically coupled to the support frame assembly to make up the sides and ceiling of the modular electromagnetically shielded enclosure; and a modular electromagnetically shielded floor assembly conductively and mechanically coupled to the sides of the modular electromagnetically shielded enclosure, the electromagnetically shielded floor assembly comprising a plurality of floor panels fastened together to form the modular electromagnetically shielded floor assembly.

The foregoing paragraph has been provided by way of introduction, and is not intended to limit the scope of the invention as described in this specification, claims, and the attached drawings.

BRIEF DESCRIPTION OF THE DRAWINGS

The invention will be described by reference to the following drawings, in which like numerals refer to like elements, and in which.

Figure 1:
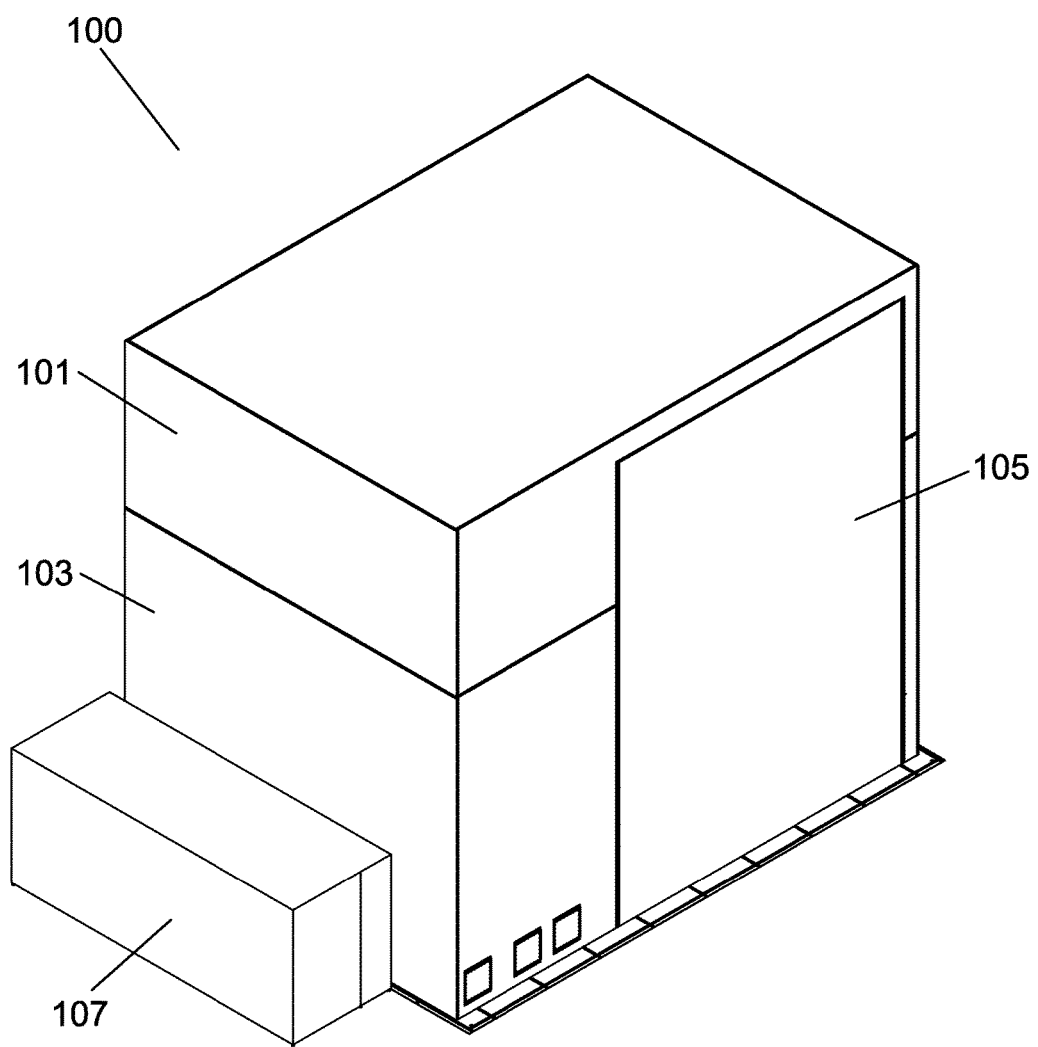
FIG. 1 is a perspective view of one example of a modular electromagnetically shielded enclosure of the present invention.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by this specification, claims, and the attached drawings.

DESCRIPTION OF THE PREFERRED EMBODIMENTS

A modular electromagnetically shielded enclosure is described herein. The shape, size and materials selected for the modular electromagnetically shielded enclosure may vary based on the intended application. For example, custom, unusual size or large scale devices may require an appropriately sized modular electromagnetically shielded enclosure. The present invention and the various embodiments depicted and envisioned herein do not rely on specific geometries, materials, or structural designs, but rather, the modular electromagnetically shielded enclosure of the present invention may be adapted and modified to fit a wide range of applications. In addition, the modular electromagnetically shielded floor assembly, the connective frame element, and other constituent components, systems, assemblies, elements and parts described herein may be employed in combination with or in substitution with other electromagnetically shielded structures, and may be adapted or modified to fit a given application. Such adaptations and modifications will become evident to one skilled in the art after reading this specification and claims, and viewing the attached drawings.

For a general understanding of the present invention, reference is made to the drawings. In the drawings, like reference numerals have been used throughout to designate identical elements.

FIG. 1 is a perspective view of one example of a modular electromagnetically shielded enclosure 100 of the present invention as seen from the outside and fully assembled. The walls, ceiling and floor are modular-made from smaller panels that are easily handled and allow the modular electromagnetically shielded enclosure to be reconfigured to meet the needs of the given application. Conductive panels 101 and 103 can be seen. The conductive panels may, in some embodiments of the present invention, be made from a conductive fabric as will be further described herein. An electromagnetically shielded door 105 can be seen. Examples of electromagnetically shielded doors include U.S. Pat. No. 8,530,756 entitled Electromagnetically Shielded Enclosure And Entry Seal to Gary William Winch. Further, an Electromagnetically Shielded Enclosure And Double Perimeter Entry Seal is disclosed by Gary William Winch and Brian Donald Smith in U.S. Pat. No. 9,029,714. The disclosure of each of these patents are incorporated herein by reference in their entirety.

The electromagnetically shielded door 105 reduces or eliminates electromagnetic leakage around the entry area and is made from a conductive material such as a metalized woven textile, and may, in some embodiments of the present invention, be the same material used for the conductive fabric panels 101/103.

In one embodiment of the present invention, the electromagnetically shielded door 105 uses magnets to facilitate proper shielding. Magnets used to facilitate proper shielding between the door and the enclosure are preferably long strips of magnetic material that can be easily sewn, encased in fabric or other material, or otherwise fastened to the perimeter of each entry and door. An example of such a magnet is the Reance SF™ Neodymium Iron Boron magnet manufactured by The Electrodyne Company of Batavia, Ohio, and further disclosed in U.S. Pat. No. 6,707,361, the entire disclosure of which is incorporated herein by reference. Magnets may also be reinforced with material such as, for example, an adhesive foam or fabric, to increase their durability.

Optionally, the modular electromagnetically shielded enclosure 100 may include an auxiliary enclosure 107 that may be made of similar construction as the overall enclosure, or may, in some embodiments of the present invention, be made from a different material with differing construction techniques.

Figure 2:
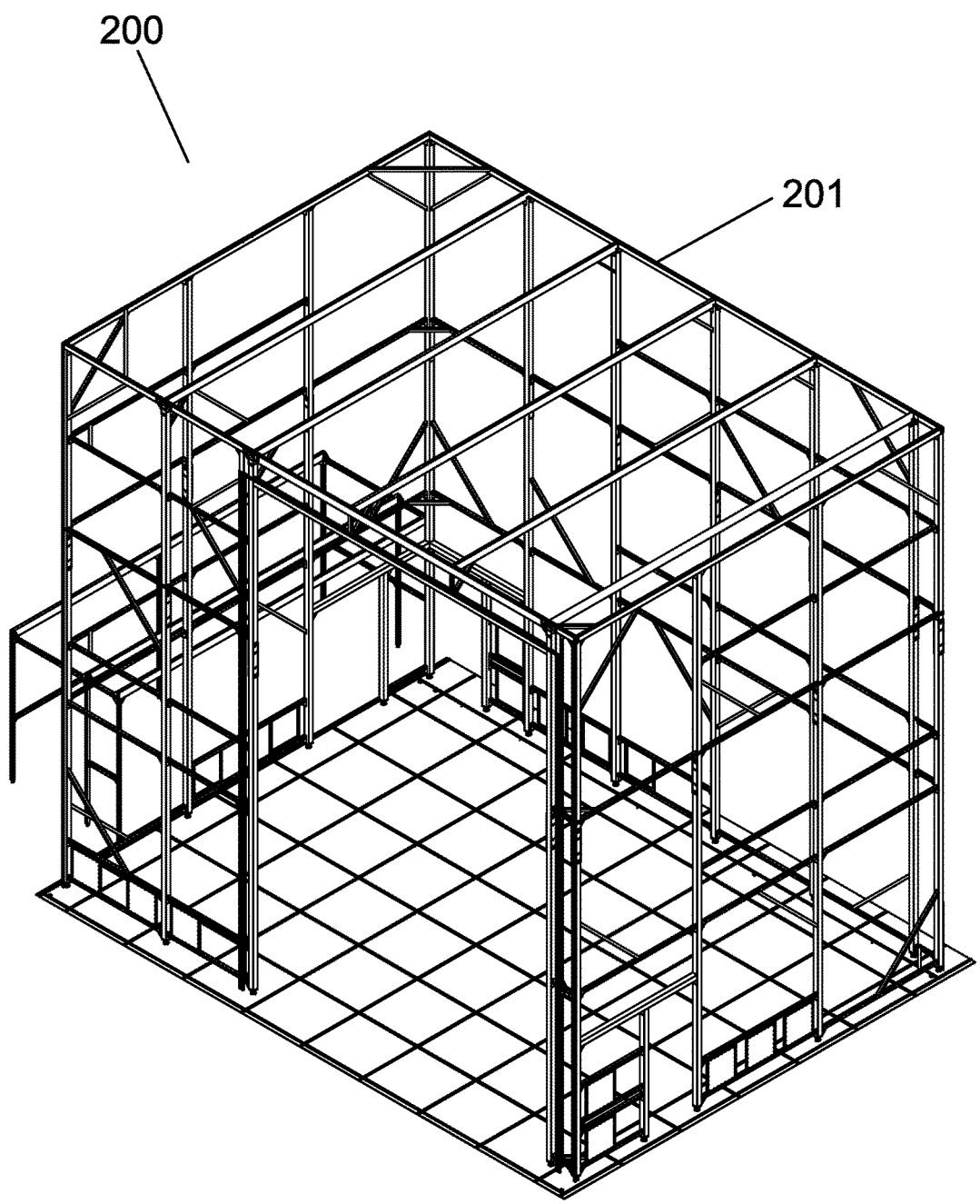
FIG. 2 is a perspective view of the support frame assembly of the modular electromagnetically shielded enclosure of FIG. 1.

To better understand the supporting structure of the modular electromagnetically shielded enclosure 100, FIG. 2 is a perspective view of the support frame assembly 200 of the modular electromagnetically shielded enclosure of FIG. 1. The support frame assembly 200 is made from a plurality of connective frame elements 201 that will be further described herein. The connective frame elements 201 can be attached to each other in a variety of ways using various connection elements and techniques to create a support frame assembly 200 that is not only of suitable size and geometry, but is also structurally sound through use of the proper quantity and size connective frame elements 201, as well as the use of proper structural design techniques such as the use of braces, trusses, cross-members, and the like. The connective frame elements may be made from aluminum, fiberglass, plastic or a polymer, or other suitable structurally sufficient material. The term connective describes the ability to provide both mechanical as well as electrical connectivity.

Figure 3:
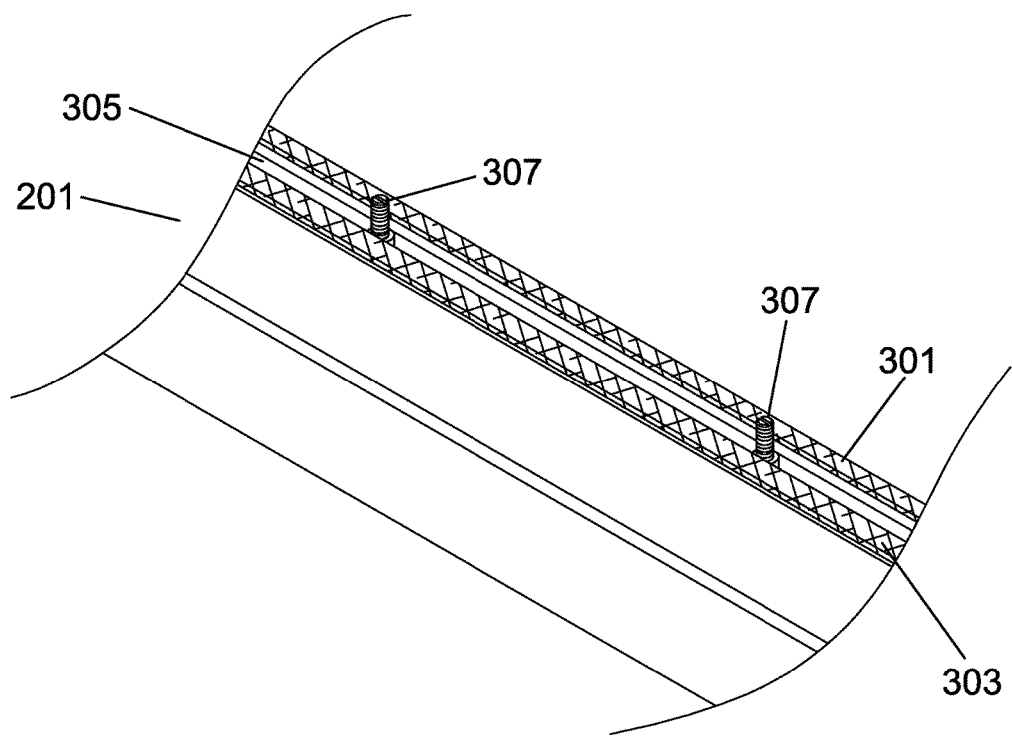
FIG. 3 is partial cutaway view of a connective frame element of the present invention.

FIG. 3 is partial cutaway view of a connective frame element of the present invention. The curved cutaway lines on either side of FIG. 3 ("S-like lines") indicate that the connective frame element 201 may be longer than depicted. In fact, a variety of lengths may be available such that there exists a number of different lengths that can be configured together to create a custom modular electromagnetically shielded enclosure.

The basic connective frame element may be an elongated conductive member made from aluminum, fiberglass, a plastic or polymer, or other suitable structurally sufficient material and may be, for example, square or rectangular stock with slots or channels to accommodate fasteners, connectors, and the like. The frame element is channelized in such a way as to accommodate fasteners, connectors, and the like. The connective frame element 201 supports conductive fabric panels that will be further described later in this specification. Fasteners 307 can be seen protruding from the frame channel 305. These fasteners 307 may be, for example, threaded stud bolts or threaded stud bolts having a slotted head for securing the stud bolt into the frame channel 305. The fasteners may be made from any suitable material, preferably conductive, such as steel, brass, stainless steel, copper, conductive plastics and polymers, and the like. The fasteners 307 provide mechanical and electrical (ohmic) coupling between the conductive fabric panels (see, for example, 101 and 103 in FIG. 1) and the support frame assembly, 200 (see FIG. 2). A first electromagnetic shielding gasket 301 can be seen generally parallel with the frame element 201 and to one side of the frame channel 305. A second electromagnetic shielding gasket 303 can be seen also generally parallel with the frame element 201 and to the other side of the frame channel 305. In some embodiments of the present invention, only a single electromagnetic shielding gasket is used. In addition, in some embodiments of the present invention more than two electromagnetic shielding gaskets are used. The electromagnetic shielding gasket may be a metal or metalized foam, metalized fabric over foam, metalized fabric over silicone, polymer, plastic, or the like, and may be adhered to the connective frame element 201 with an adhesive, fasteners, bonding agents, or the like. The electromagnetic shielding gasket makes ohmic contact between the conductive fabric panel(s) and the connective frame elements 201, providing further electromagnetic shielding effectiveness. In some embodiments of the present invention, for example the use of a non-conductive connective frame element, the electromagnetic shielding gaskets may also be made from a suitable non-conductive material. The gasket, however, still facilitates electromagnetic shielding by applying pressure or force between the conductive panels to ensure proper and adequate ohmic contact, and is still to be considered an electromagnetic shielding gasket in that it facilitates or enables electromagnetic shielding. It should also be noted that in some embodiments or applications thereof, jumpers or other bonding elements may also be employed to ensure good electrical (ohmic) contact between the conductive panels.

Figure 4:
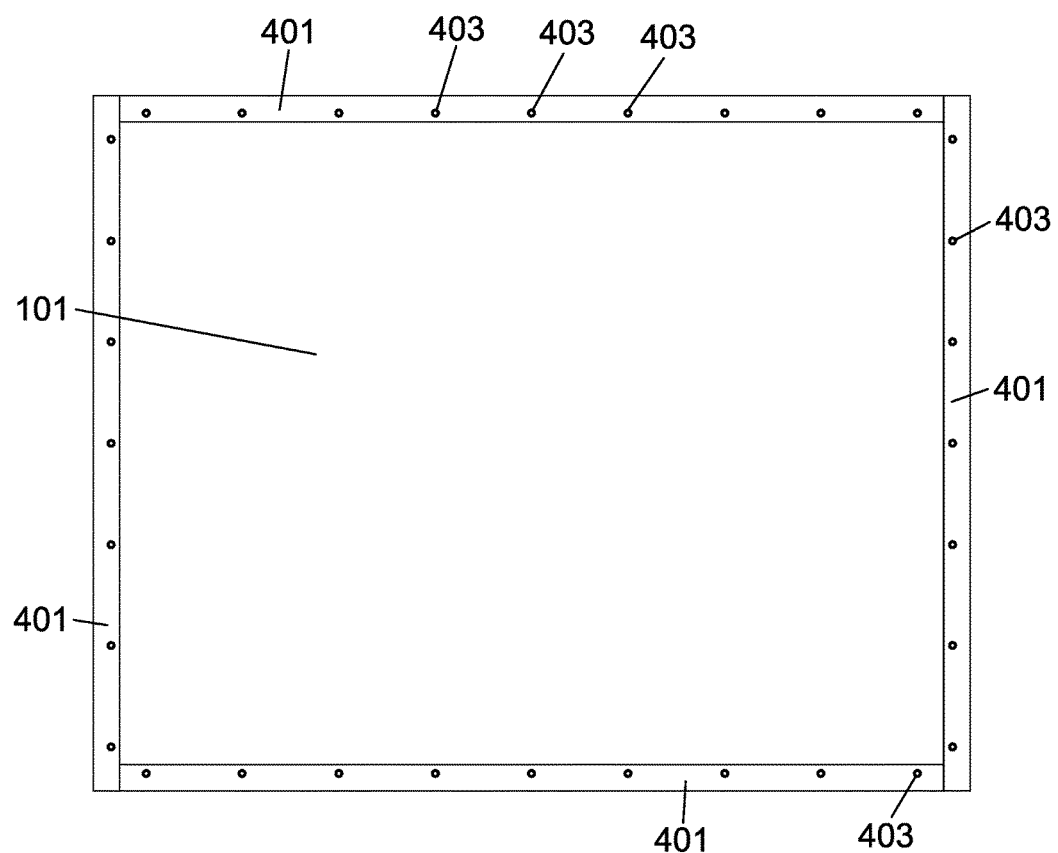
FIG. 4 is a plan view of a conductive fabric panel of the modular electromagnetically shielded enclosure of the present invention.

FIG. 4 is a plan view of a conductive panel 101 of the modular electromagnetically shielded enclosure of the present invention. The conductive panel 101 comprises the outer shell or covering of the modular electromagnetically shielded enclosure, and may include the sides, top, ceiling or roof, and in some embodiments the floor. While in some configurations one large conductive panel may be sufficient, with suitable folds and cuts, to cover the entire modular electromagnetically shielded enclosure, in more likelihood a plurality of conductive panels will be employed using the connective frame elements 201 to join multiple conductive panels together. The conductive panels 101 (or 103) may be conductive fabric panels and are made from a conductive material such as, for example, a metalized woven textile, a mesh, a metal, a non-woven textile or metal, and the like. Other materials may also be included in the modular electromagnetically shielded enclosure. In addition, the materials may be layered or compositely structured to accomplish additional shielding effectiveness, weather resistance, structural integrity, and the like. An example of such a metalized woven textile is a silver plated woven nylon ripstop fabric sold under the tradename ProTex Ag by Carolina Silver Technologies of Maiden, N.C. In some embodiments of the present invention, the fabric may be fire retardant or be treated with a fire retardant coating or impregnation. An example of a flame retardant coating is a dispersion of halogenated hydrocarbons and antimony, such as, for example, APEX BACKOTE #7245 by Apexical, Inc. of Spartanburg, S.C. Other coatings, such as waterproofing or weatherproofing coatings may also be applied in some embodiments of the present invention.

Some conductive panels 101/103 may also have a viewing window to allow for the viewing of electronic devices under test or operation within the enclosure and further to let exterior light enter the modular electromagnetically shielded enclosure. The window may be made from a fine metal mesh that may also, in some embodiments of the present invention, be sandwiched between one or more pieces of transparent material such as vinyl or the like. In some embodiments of the present invention, the window may be made from a woven or a non-woven metal or metalized fabric or cording, and may for example be made from a fabric suitable for shielding such as a metalized fabric. An example of a suitable metalized fabric is the silver plated nylon warp knitted fabric manufactured by Carolina Silver Technologies. LLC of Valdese, N.C. and sold as Salem Antibacterial Fabric under style number 53951348. The window may also have a suitable radiofrequency seal such as a conductive gasket, stitching, magnets, or the like.

Ventilation panels or ports as well as pass throughs or I/O plates may also be incorporated into the conductive panels. Ventilation panels, for example, may employ conductive mesh or honeycomb structures such as honeycomb waveguides.

The conductive fabric panel 101 may be rectangular or square, and may have a perimeter hem or bias 401 to ensure that the edge of the metalized fabric is not exposed in a way that would allow it to unravel or otherwise deteriorate with use. The perimeter hem or bias 401 also contains a plurality of grommets 403 to allow attachment of the conductive fabric panel to the various connective frame elements 201 that make up the support frame assembly 200 (see FIG. 2). In one embodiment of the present invention, the grommets 403 create an opening to allow fasteners 307 (see FIG. 3) to pass through. The grommets may be made from a conductive material to provide electrical continuity with the conductive fabric that makes up the panel 101.

The conductive fabric panel 101 may be constructed using standard stitching, and may also, in some embodiments, be constructed using adhesives or other fabric fastening techniques known to those skilled in the art. Thread may be conductive metalized thread or standard non-conductive thread. The conductive fabric panel 101 may also be made from a single layer of fabric, or, in some embodiments of the present invention, may be made from multiple layers of fabric, or a combination thereof. For example, multi-layer conductive fabric panels may be used in areas of the modular electromagnetically shielded enclosure that require additional shielding, while single layer panels may be used elsewhere.

Figure 5:
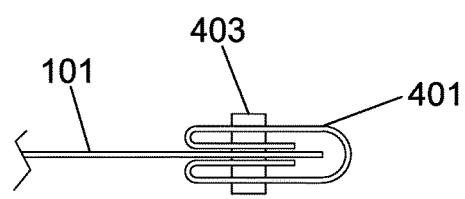
FIG. 5 is a side view of a perimeter hem of the conductive fabric panel of FIG. 4 before being finished.

FIG. 5 is a side view of a perimeter hem 401 (see FIG. 4) of the conductive fabric panel of FIG. 4 before being finished (stitched with grommet termination). The conductive fabric panel 101 is seen with a perimeter hem 401 covering the edge of the conductive fabric panel 101. There may be various ways to cover the edge of the conductive fabric panel 101 with a piece of fabric that is preferably conductive. As depicted in FIG. 5, the fabric that makes up the hem or bias is folded back onto itself so that no exposed edges are present that may unravel, fray, or otherwise create a less than finished construction. The fabric hem or bias is then stitched or otherwise bonded together to make a finished conductive fabric panel. Grommets 403 are then placed through the hem to allow for fastening to the various elements of the support frame assembly. In some embodiments, other style fasteners are used in place of grommets for fastening the conductive fabric panel to the various elements of the support frame assembly. Grommets, for example, are placed in the hem using a tool such as a grommet press where the grommet is placed through or in a hole that has been created in the fabric and then pressed or otherwise put in place.

Figure 6:
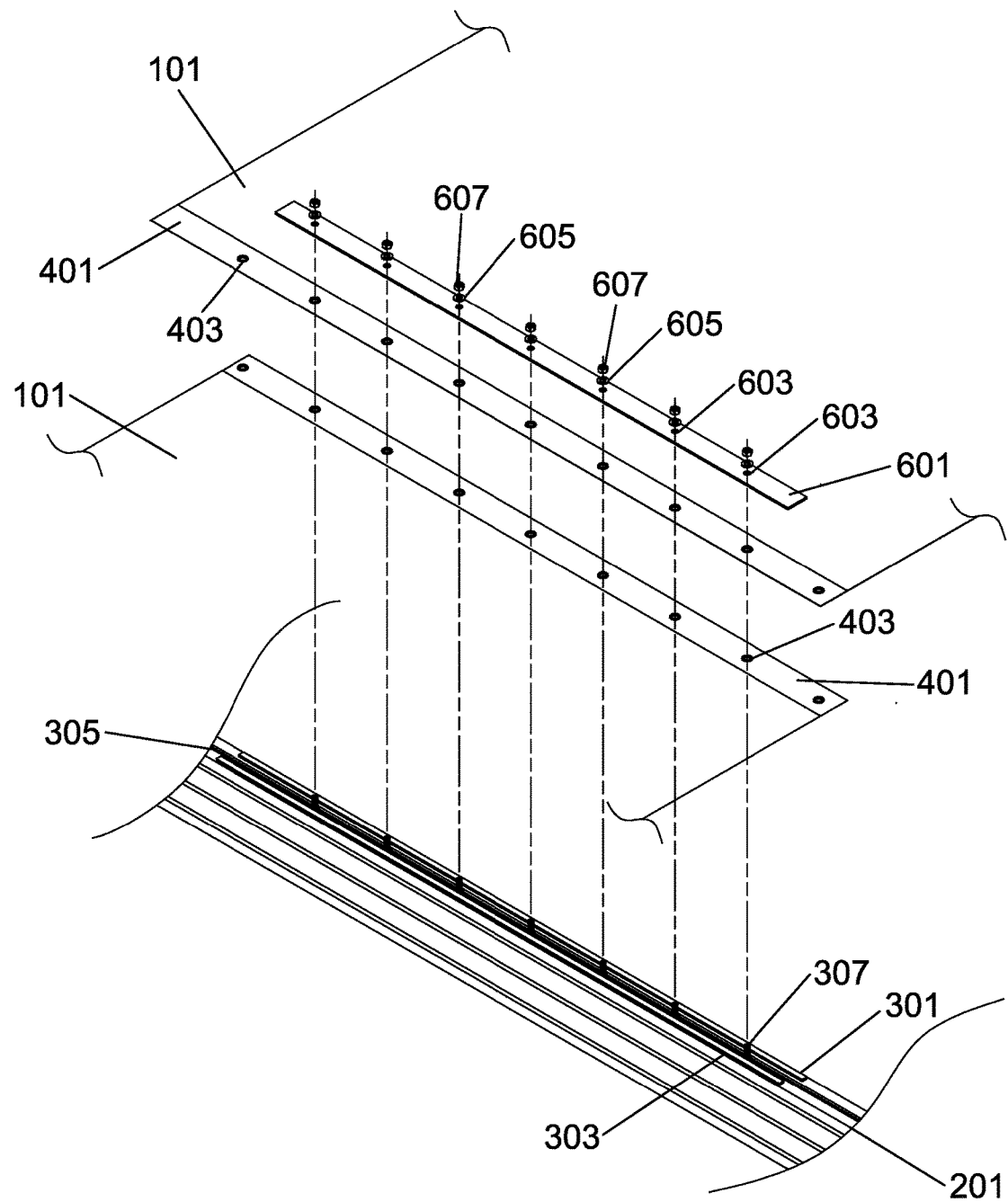
FIG. 6 is an exploded view of two conductive fabric panels joined to a connective frame element.

FIG. 6 is an exploded view of two conductive fabric panels 101 joined to a connective frame element. The conductive panels 101 are shown partially broken to facilitate proper sizing of the drawing. As seen, the edges (perimeter hem 401) of each conductive panel are aligned such that the grommets 403 line up to allow the fasteners 307 to pass through the grommets on each of the conductive panels 101. The fasteners 307 protrude from the connective frame element 201 and may be stud bolts or the like. As previously described, the fasteners 307 are contained by a channel 305, with a feature such as a flare or a head being used to retain the fastener 307 in the frame channel 305. As previously described, electromagnetic shielding gaskets can be seen along the connective frame element 201 to create an electromagnetic seal between the frame elements 201 and the conductive fabric panels 101, specifically the perimeter hem 401 of the conductive fabric panels 101. Once two conductive fabric panels 101 are placed on a connective frame element 201 with the fasteners 307 inserted through the grommets of each panel, as seen in FIG. 6, a conductive strip 601 is placed on top of the two conductive fabric panels in such a way that the holes 603 in the conductive strip 601 receive the fasteners 307 as depicted in FIG. 6. The conductive strip is then secured by placing a nut 607 and washer 605, or similar fastening arrangement, on each fastener 307 and tightening down each nut 607 such that the conductive strip applies generally uniform pressure down onto the connective frame element 201 and the electromagnetic shielding gaskets make ohmic contact with the perimeter hem of the conductive fabric panels. The conductive strip 601 may be made from a metal such as steel, stainless steel, brass, copper, or the like, or may, in some embodiments of the present invention, be a conductive plastic or have conductive elements embedded or adhered to the strip 601 to facilitate good ohmic contact. In use, the conductive fabric panels 101 may be folded, curved or otherwise formed to accommodate corners and edges of the modular electromagnetically shielded enclosure 100. Of course variants of fasteners and related fastening techniques are also be possible, and are in keeping with the spirit and broad scope of the present invention as described and envisioned herein.

Figure 7:
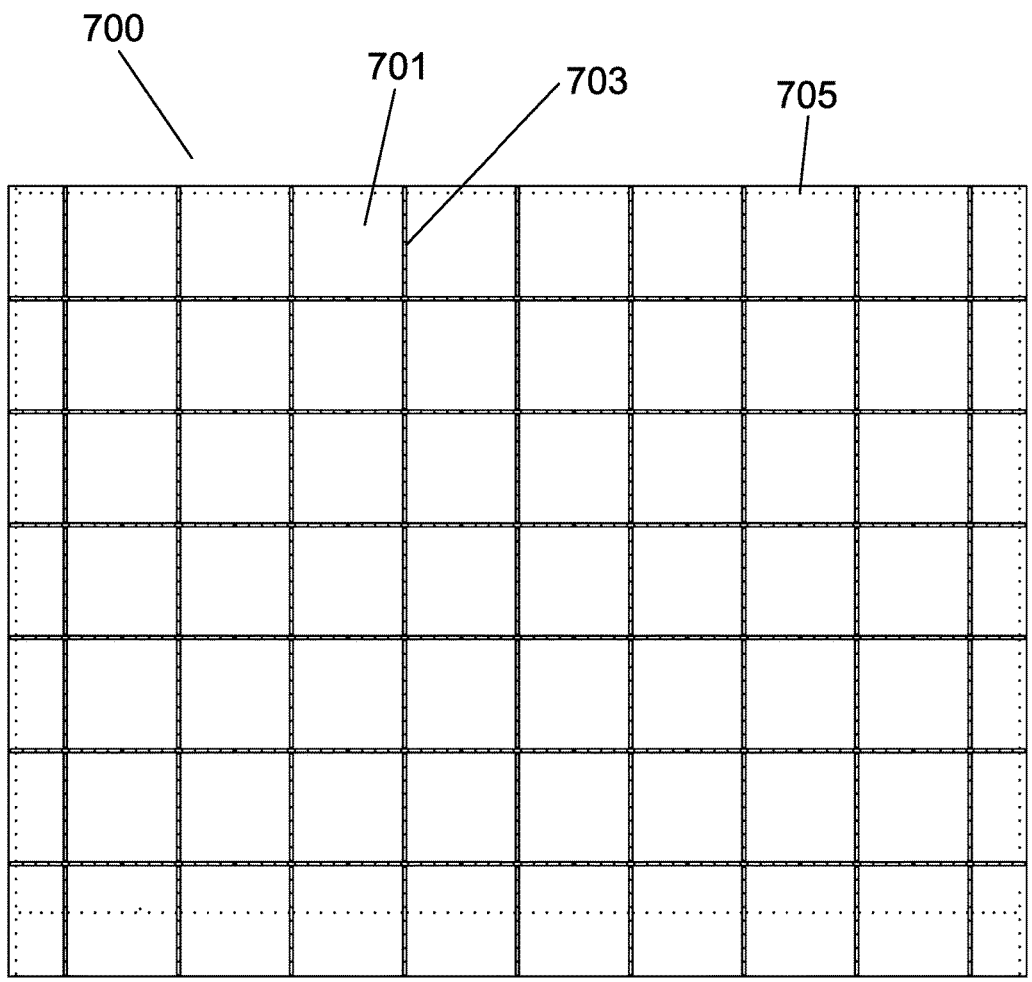
FIG. 7 is a plan view of a modular electromagnetically shielded floor assembly of the present invention.
Figure 8:
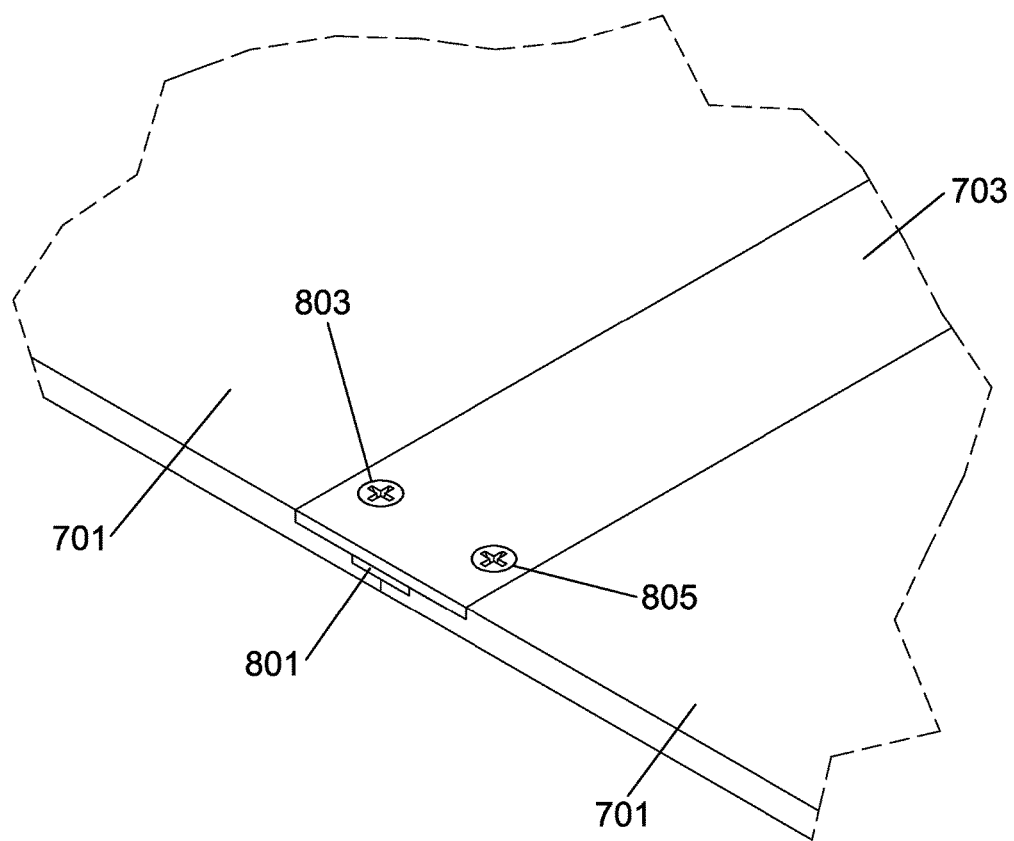
FIG. 8 is a perspective view of joined floor panels that make up the modular electromagnetically shielded floor assembly of the present invention.
Figure 9:
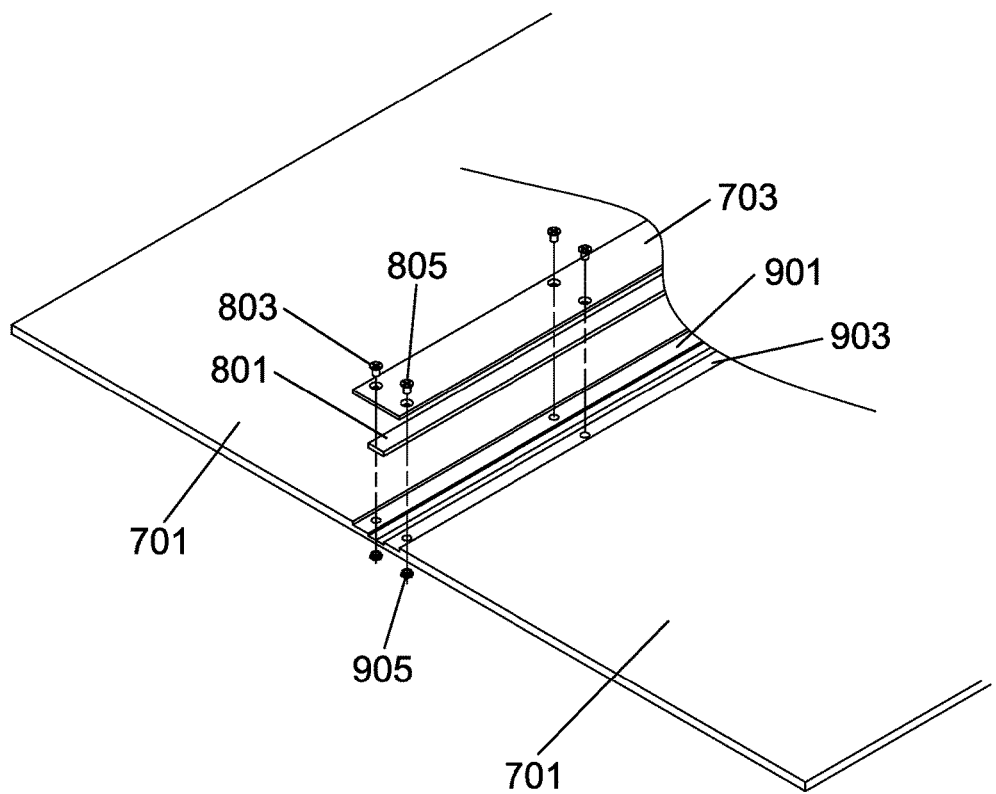
FIG. 9 is an exploded view of joined floor panels that make up the electromagnetically shielded floor assembly of the present invention.
Figure 10:
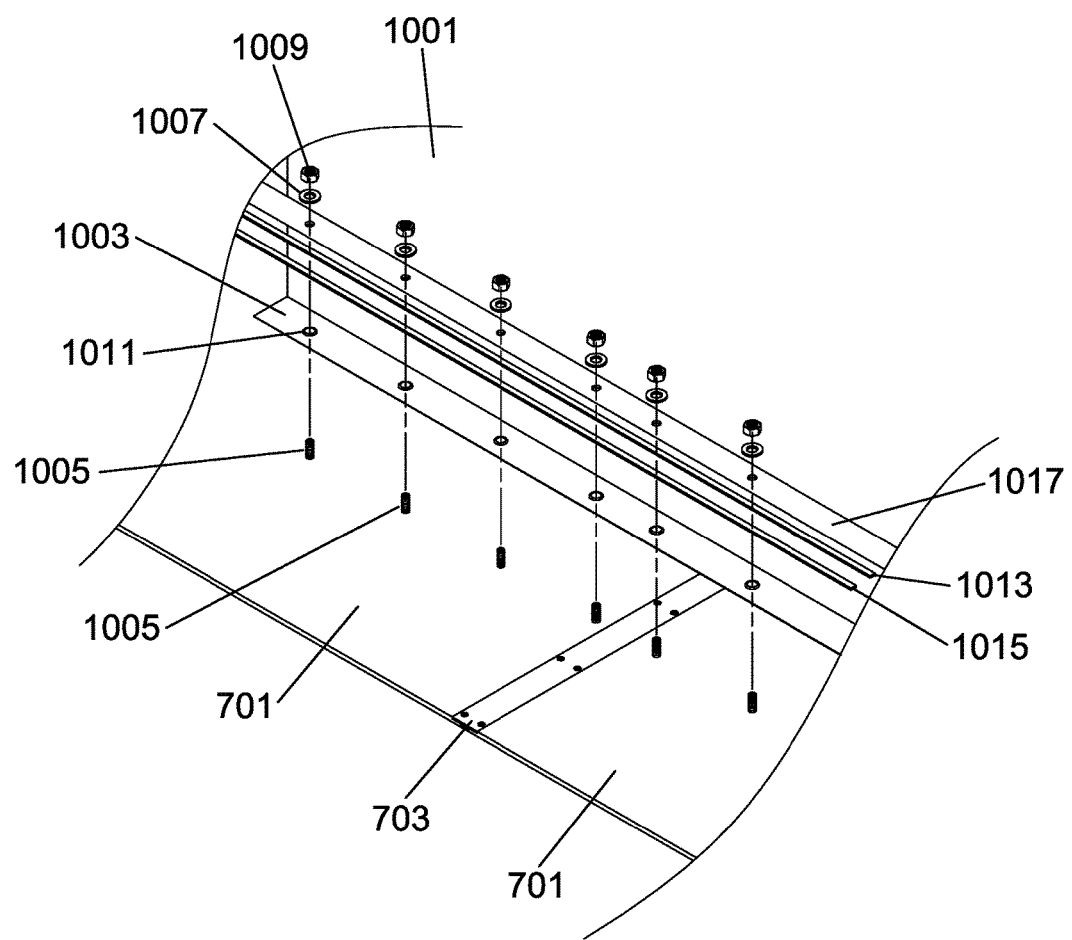
FIG. 10 is an exploded view of a wall panel joined to a floor panel.

FIG. 7 is a plan view of a modular electromagnetically shielded floor assembly 700 of the present invention. The modular electromagnetically shielded floor assembly 700 comprises a first floor panel having at least one rabbet edge for conjoining to a second floor panel and a second floor panel having at least one rabbet edge for conjoining to a first floor panel. In many embodiments of the present invention, a plurality of floor panels 701 are employed. Each floor panel 701 is of a rectangular or square shape and is made from a conductive material such as a metal, for example, aluminum, steel, stainless steel, copper, brass, or the like. In some embodiments of the present invention, a conductive plastic composite may be employed. The floor panels have a rabbet edge as seen in FIGS. 8 and 9 to facilitate an electromagnetically tight seal between multiple floor panels. Floor panel connectors 703 can be seen in FIG. 7 that fasten the edges of adjoining floor panels together. Also seen in FIG. 7, which shows a modular electromagnetically shielded floor assembly, are perimeter fasteners 705 that allow the bottom edge of the conductive fabric panels to be mechanically joined to the modular electromagnetically shielded floor assembly to achieve an electromagnetically tight seal. The perimeter fasteners 705 are also shown in FIG. 10 as floor perimeter fasteners 1005, and may be stud bolt fasteners to receive grommets on the conductive fabric panels 101/103 (see FIG. 1 for example).

FIG. 8 is a perspective view of joined floor panels 701 that make up the modular electromagnetically shielded floor assembly 700 of the present invention. The rabbet edges of each floor panel 701 can be clearly seen and form a channel when two floor panels 701 are conjoined. This channel accommodates an electromagnetic shielding gasket 801 and may be made from a conductive material including, for example, a metal, a metalized fabric, a metalized foam, a metalized extrusion, and the like. The floor panels 701 may have a double rabbet edge where a lower or first rabbet edge forms the channel where the electromagnetic shielding gasket 801 is placed, and the upper or second rabbet edge accommodates the floor panel connector 703. The floor panel connector 703 is a strip or otherwise generally rectangular piece of metal such as aluminum, steel, stainless steel, copper, brass, or the like, and has holes to accommodate fasteners such as the first fastener 803 and the second fastener 805 seen in FIG. 8. These fasteners may be bolts, screws, or other such fasteners. They retain the floor panel connector 703 onto the floor panels and allow the floor panel connectors 703 to mechanically retain the floor panels together, thus creating the modular electromagnetically shielded floor assembly 700 that is depicted in FIG. 7. The floor panel connector 703 also retains and compresses the electromagnetic shielding gasket 801.

FIG. 9 is an exploded view of joined floor panels 701 that make up the modular electromagnetically shielded floor assembly 700 of the present invention. Each rabbet edge 901 and 901 can be seen placed together to form a channel for receiving the electromagnetic shielding gasket 801 and also to form a channel for receiving the floor panel connector 703. In some embodiments of the present invention, threaded holes are provided to receive the fasteners 803, 805. In other embodiments (such as with softer metal panels like aluminum), threaded inserts 905 are used to retain the fasteners 803 and 805 as shown in FIG. 9.

Lastly. FIG. 10 is an exploded view of a wall panel joined to a floor panel. The wall panels are made from conductive fabric panels 1001 (also shown as 101 and 103 in FIG. 1). Floor panels 701 can be seen along with floor perimeter fasteners 1005 such as stud bolts, which are threaded or otherwise retained by and protruding from the floor panels 701. The conductive fabric panels 1001 have perimeter hems 1003 (also shown as 401 in FIG. 1). The grommets 1011 (also shown as 403 in FIG. 4) are placed on the floor perimeter fasteners 1005 as depicted in FIG. 10 and a conductive strip 1017 (also shown as 601 in FIG. 6) is used to retain the perimeter hem 1003 to the floor panels 701. Further, an electromagnetic shielding gasket is placed between the conductive strip 1017 and the perimeter hem 1003. Preferably, a first floor electromagnetic shielding gasket 1013 and a second floor electromagnetic shielding gasket 1015 are employed. The floor electromagnetic shielding gasket may be a metal or metalized foam, polymer, plastic, or the like, and may be adhered to the conductive strip 1017 with an adhesive, fasteners, bonding agents, or the like.

The conductive strip 1017 is retained onto the floor panels 701 by nuts 1009 and washers 1007 attached to the floor perimeter fasteners 1005. The conductive fabric panel 1001 is further retained between the conductive strip 1017 and the floor panel 701.

In using the modular electromagnetically shielded enclosure 100, an electronic device, system, or device that includes electronics may be placed within the modular electromagnetically shielded enclosure. In some uses, the device may be connected by way of cables that pass from the shielded environment inside the electromagnetically shielded enclosure to the outside environment by way of a feed through or similar arrangement.

It is, therefore, apparent that there has been provided, in accordance with the various objects of the present invention, a modular electromagnetically shielded enclosure. While the various objects of this invention have been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of this specification, claims and the attached drawings.

What is claimed is:

1. A modular electromagnetically shielded enclosure having sides, a ceiling and a floor, the modular electromagnetically shielded enclosure comprising:
   a support frame assembly comprising a plurality of connective frame elements;
   wherein each connective frame element comprises a first electromagnetic shielding gasket;
   wherein the first electromagnetic shielding gasket of each connective frame element is generally parallel with the associated connective frame element;
   at least one conductive panel coupled to the support frame assembly to make up the sides and ceiling of the modular electromagnetically shielded enclosure; wherein the at least one conductive panel comprises perimeter fasteners; and
   a modular electromagnetically shielded floor assembly conductively and mechanically coupled to the sides of the modular electromagnetically shielded enclosure, the electromagnetically shielded floor assembly comprising a plurality of floor panels fastened together to form the modular electromagnetically shielded floor assembly.

2. The modular electromagnetically shielded enclosure of claim 1, wherein each connective frame element further comprises a second electromagnetic shielding gasket.

3. The modular electromagnetically shielded enclosure of claim 2, wherein the second electromagnetic shielding gasket of each connective frame element is generally parallel with the associated connective frame element.

4. The modular electromagnetically shielded enclosure of claim 1, wherein each connective frame element further comprises a plurality of fasteners for connection with conductive panels.

5. The modular electromagnetically shielded enclosure of claim 4, wherein the fasteners are threaded bolt studs.

6. The modular electromagnetically shielded enclosure of claim 1, further comprising an electromagnetically shielded door.

7. The modular electromagnetically shielded enclosure of claim 1, further comprising an electromagnetically shielded window.

8. The modular electromagnetically shielded enclosure of claim 1, wherein the at least one conductive panel is a conductive fabric panel.

9. The modular electromagnetically shielded enclosure of claim 1, wherein the perimeter fasteners are grommets.

10. A modular electromagnetically shielded enclosure having sides, a ceiling and a floor, the modular electromagnetically shielded enclosure comprising:
    a support frame assembly comprising a plurality of connective frame elements;
    wherein each connective frame element comprises a first electromagnetic shielding gasket;
    wherein the first electromagnetic shielding gasket of each connective frame element is generally parallel with the associated connective frame element;
    at least one conductive panel coupled to the support frame assembly to make up the sides and ceiling of the modular electromagnetically shielded enclosure; wherein the at least one conductive panel comprises perimeter fasteners; and
    a modular electromagnetically shielded floor assembly conductively and mechanically coupled to the sides of the modular electromagnetically shielded enclosure, the electromagnetically shielded floor assembly comprising a plurality of floor panels fastened together with an electromagnetic shielding gasket placed between the floor panels wherein each floor panel comprises a rabbet edge capable of accommodating the electromagnetic shielding gasket to form the modular electromagnetically shielded floor assembly.

11. The modular electromagnetically shielded enclosure of claim 10, wherein the modular electromagnetically shielded floor assembly further comprises a floor panel connector that spans and connects adjoining floor panels and retains the electromagnetic shielding gasket there between.

12. A modular electromagnetically shielded floor assembly comprising:
    a first floor panel having at least one rabbet edge for conjoining to a second floor panel;
    a second floor panel having at least one rabbet edge for conjoining to the first floor panel;
    an electromagnetic shielding gasket capable of being placed in a channel formed by the conjoining of the first floor panel and the second floor panel along the rabbet edge of each; and
    a floor panel connector to mechanically and conductively fasten the conjoined first floor panel and second floor panel with the electromagnetic shielding gasket.

13. The modular electromagnetically shielded floor assembly of claim 12, wherein the floor panel connector further comprises fasteners for mechanically coupling the floor panel connector to each floor panel.

14. The modular electromagnetically shielded floor assembly of claim 12, wherein the floor panel connector is installed in the channel formed by the conjoining of the first floor panel and the second floor panel along the rabbet edge of each floor panel such that the floor panel connector sits flush with each floor panel.

* * * * *